United States Patent [19]

Dietrich et al.

[11] Patent Number: 5,424,227
[45] Date of Patent: Jun. 13, 1995

[54] METHOD OF MANUFACTURE OF SILICON-GERMANIUM HETEROBIPOLAR TRANSISTORS

[75] Inventors: Harry Dietrich, Kirchardt; Andreas Gruhle, Heilbronn, both of Germany

[73] Assignees: Temic Telefunken microelectronic GmbH, Heilbronn; Daimler-Benz AG, Stuttgart, Germany

[21] Appl. No.: 178,138

[22] Filed: Jan. 6, 1994

[30] Foreign Application Priority Data

Jan. 20, 1993 [DE] Germany .................. 43 01 333.3

[51] Int. Cl.$^6$ ............................................ H01L 21/331
[52] U.S. Cl. ................................. 437/31; 437/131; 437/110; 437/126; 437/200
[58] Field of Search ............... 437/31, 32, 126, 133, 437/110, 131, 132, 103, 106, 909; 148/DIG. 59

[56] References Cited

U.S. PATENT DOCUMENTS

| | | | |
|---|---|---|---|
| 4,529,455 | 7/1985 | Bean et al. | 437/110 |
| 5,106,767 | 4/1992 | Comfort et al. | 437/31 |
| 5,180,684 | 1/1993 | Fujioka | 148/DIG. 59 |
| 5,250,448 | 10/1993 | Hamasaki et al. | 437/31 |
| 5,346,840 | 9/1994 | Fujoka | 437/131 |

FOREIGN PATENT DOCUMENTS

0418421A1 3/1991 European Pat. Off. .
4102888A1 8/1991 Germany .

OTHER PUBLICATIONS

Yang, F. M. et al.: Formation of Bilayer Shallow MoSi CoSi Salicide Contact Using W/Co-MoAlloy Metallization. In: Jpn. J. Appln. Phys., vol. 31, 1992, pp. 1004–1011.
N. N.: Slective Epitacial Base with Si/Ge Banga for Double-Poly Self aligned Bipolar Transistors. In: IBM Technical Disclosure Bulletin, vol. 34, No. 8, Jan. 1992 pp. 86–88.
K. Mitani et al.: Planar AlGaAs/GaAs Heterojunction Bipolar Transistors Fabricated Using Selective W-CVD. In: IEEE Electron Device Letters, vol. 13, No. 4, Apr. 1992 pp. 209 and 210.

*Primary Examiner*—Brian E. Hearn
*Assistant Examiner*—Tuan Nguyen
*Attorney, Agent, or Firm*—Spencer, Frank & Schneider

[57] ABSTRACT

Manufacture of a semiconductor array of integrated silicon-germanium heterobipolar transistors having a silicon collector layer, a silicon-germanium base layer, a silicon emitter layer and a silicon emitter contact layer includes depositing in a single uninterrupted process and simultaneously doping the collector layer, the base layer, the emitter layer and the emitter contact layer. A base connection region is formed at the side of the base layer such that the intersection surfaces of the base/emitter/PN boundary layer and of the base/collector PN boundary layer with the surface of the semiconductor array are outside the silicon-germanium base layer. A silicon dioxide layer is formed by thermal oxidation over the entire exposed surface of the semiconductor array.

10 Claims, 3 Drawing Sheets

METHOD OF MANUFACTURE OF SILICON-GERMANIUM HETEROBIPOLAR TRANSISTORS

BACKGROUND OF THE INVENTION

1. Field of The Invention

The invention relates to the field of semiconductor manufacture, in particular, the manufacture of arrays of integrated silicon-germanium heterobipolar transistors.

2. Background Information

In addition to gallium-arsenide transistors, silicon-germanium heterobipolar transistors (SiGe HBTs) are increasingly being used for applications in the extremely high frequency range (for example in communications technology or in satellite circuits). Integrated NPN transistors with the layer sequence N-Si collector layer, P-SiGe base layer, N-Si emitter layer and N+-Si emitter connection layer are preferably used, where the thin SiGe base layer (layer thickness approx. 30-80 nm)—strained due to the differing lattice constants of silicon and silicon-germanium (SiGe)—is of crucial importance for the operation and the properties of the transistor.

The semiconductor array of the SiGe HBTs is preferably made using epitaxy methods (gas phase epitaxy/CVD, molecular beam epitaxy/MBE) or by implantation methods. Problems occur during the manufacturing process in particular because

- the process temperature must not exceed certain values (typically 700° C.) in order to prevent any relaxation of the strained SiGe layer,
- every interruption in the growth of the layer structure (collector, base, emitter, emitter contact) on the one hand necessitates a high-temperature cleaning operation (risk of relaxation of the SiGe layer) and on the other hand contaminates the sensitive emitter/base boundary surface or base/collector boundary surface now exposed, i.e. not covered.
- doping of the semiconductor layers after manufacture of the layer structure poses difficulties: firstly, the requirement that the Si/SiGe boundary surfaces on the one hand and the PN junctions on the other hand are exactly congruent in order to avoid disadvantageous component properties is difficult if not impossible to achieve; secondly, intolerable damage occurs when implanting the dopants in the semiconductor layers, and necessitates an additional anneal process step, which in its turn causes unwelcome diffusion processes,
- in order to form contacts, the deposited semiconductor layers have to be partially removed again; this results in the formation of unpassivated Si or SiGe surfaces that cause leakage currents. Subsequent passivation of these surfaces can only be achieved with difficulty and the leakage currents cannot be completely suppressed.

SUMMARY OF THE INVENTION

The object underlying the invention is to provide a method for manufacturing integrated silicon-germanium heterobipolar transistors in which the above problems are avoided and thee favorable or improved component properties of the manufactured transistors are assured.

This object is attained in accordance with the invention. Advantageous embodiments of the method are set forth below.

In the presented silicon-germanium heterobipolar transistor, a) the manufacture of the complete layer structure of the HBT—the layer growth (collector layer, base layer, emitter layer, emitter contact layer) including doping of the layers—is implemented in a single, uninterrupted process (for example by MBE or CVD); this rules out any contamination between the critical transistor layers. During layer growth, a high-temperature cleaning operation is not necessary, so that the strained SiGe layer cannot relax; since no subsequent doping of the semiconductor layers is necessary, the problems entailed by diffusion processes or implantation processes are not encountered.

b) a base connection region is formed and a double-mesa structure of the semiconductor array is formed such that the two PN junctions in the area of the base connection region (base/emitter/PN junction and base/collector/PN junction) are respectively above and below the SiGe layer (base/emitter boundary layer or base/collector boundary layer). To this purpose, part of the emitter contact layer is first removed in a etching step using an auxiliary layer—however the SiGe layer remains "buried" underneath the Si emitter layer, so that there is no silicon/germanium at the surface. Then an implantation process is carried out (for example self-aligned by means of a first spacer oxide layer), whereby on the one hand the exposed emitter layer is redoped (changed into a base connection region) and on the other hand the external base/collector/PN junction is slightly moved into the Si layer underneath the SiGe layer or underneath the base/collector boundary layer. Self-alignment firstly allows the distance from the base connection region to the emitter contact layer to be kept small (minimal), so that the extrinsic base resistance, too, is minimized (which is also advantageous for good HF properties of the component); secondly, the points at which the PN junctions break the surface are in the silicon layer and are not in contact with the silicon-germanium. Finally, part of the base connection region and of the collector layer is selectively removed in order to form a mesa-type structure by a second (mesa) etching step with the aid of a mask; furthermore, field oxide regions for separation of the active structures of the integrated circuit are formed.

c) by thermal oxidation over the entire exposed surface of the semiconductor array, a high-quality silicon dioxide layer is formed, such that the PN junctions on the surface, which are not in contact with the silicon-germanium layer, are very effectively protected (passivated) and only slight leakage currents occur.

d) the base connection contact is brought as close as possible to the inner base zone by a second self-aligned process step. With the aid of a second spacer oxide layer—which is wider than that in the first self-aligned process step—this distance is self-aligned and minimized.

The component properties of a SiGe HBT manufactured with the method described are improved since the drawbacks described at the outset are avoided during the manufacturing process, the semiconductor array is manufactured with self-alignment by the use of spacers, the dimensions of the component can be reduced, the component retains its favorable (high frequency) properties in an integrated circuit, too.

DESCRIPTION OF A PREFERRED EMBODIMENT

The invention is further described in detail on the basis of an embodiment; in FIGS. 1–8 various process steps in the manufacturing process for an NPN silicon-germanium hetero- bipolar transistor with a P silicon-germanium base layer are described.

Figure 1:
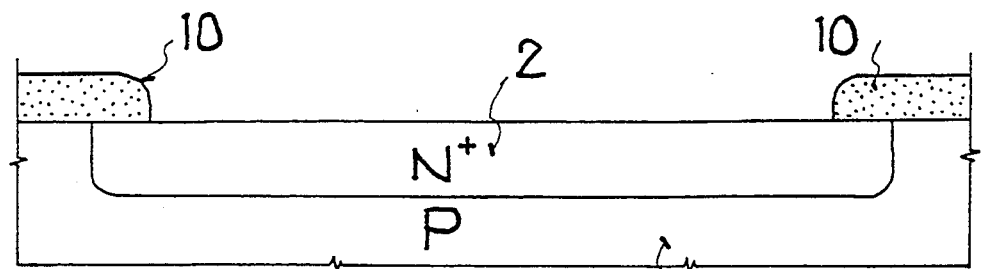
FIG. 1 is an initial stage of an exemplary method according to the invention showing a masking layer formed and patterned on a P-doped silicon substrate wafer an implanted collector connection layer formed therein.

FIG. 1: On the surface of a P-doped silicon substrate wafer 1 a (masking) oxide layer 10 is formed by thermal oxidation and patterned with photoresist; the N+ collector connection layer 2 ("buried layer") is formed by implantation and post-diffusion of arsenic ions.

Figure 2:
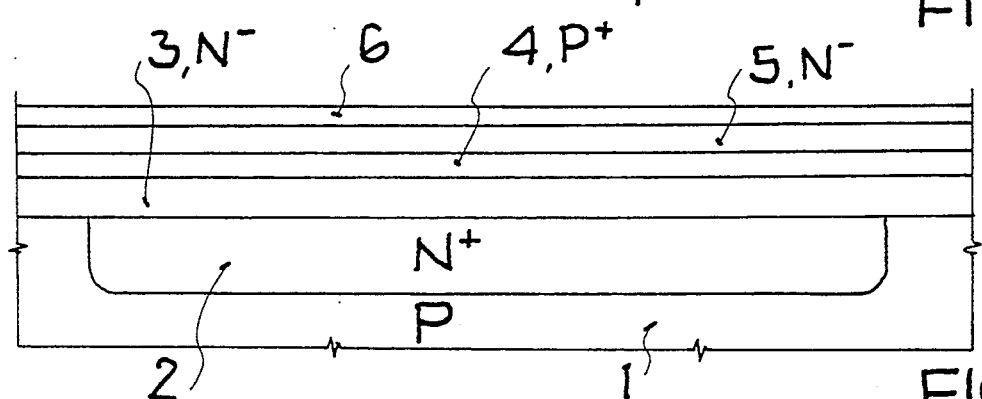
FIG. 2 shows a stage of manufacture subsequent to FIG. 1 of an exemplary method according to the invention.

FIG. 2: After removal of the masking oxide layer 10, the layer sequence of the SiGe HBT is grown in a single process (for example using molecular beam epitaxy MBE) without interruption, with simultaneous doping of the layers. The layer sequence comprises the N− collector layer 3 (for example with a layer thickness of 300 nm and a doping concentration of $10^{16}$ to $10^{17}$ cm$^{-3}$), the P+ SiGe base layer 4 (germanium proportion for example 20%, layer thickness 50 nm and doping concentration $10^{19}$ cm$^{-3}$), the N− emitter layer 5 (for example with a layer thickness of 100 nm and a doping concentration of $10^{18}$ cm$^{-3}$) and the N+ emitter contact layer 6 (for example with a layer thickness of 50 nm and doping concentration exceeding $10^{20}$ cm$^{-3}$).

Figure 3:
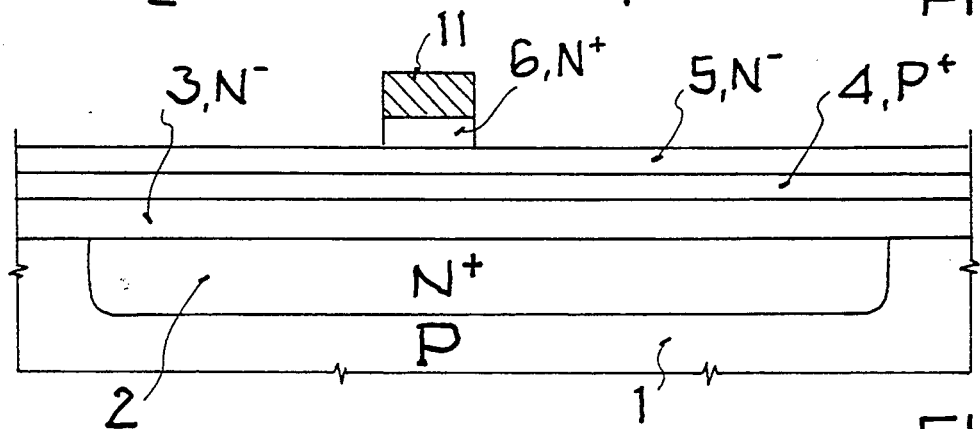
FIG. 3 shows a stage of manufacture subsequent to FIG. 2 of an exemplary method according to the invention.

FIG. 3: An auxiliary layer 11 (for example of silicon nitride $Si_3N_4$) is deposited over the full surface of the N+ emitter contact layer 6 (for example by a CVD method), with a layer thickness of approx. 0.3 μm and patterned with photoresist; part of the $Si_3N_4$ auxiliary layer 11 and of the Si emitter contact layer 6 is etched off anisotropically—the emitter layer 5 remains above the SiGe base layer 4.

Figure 4:
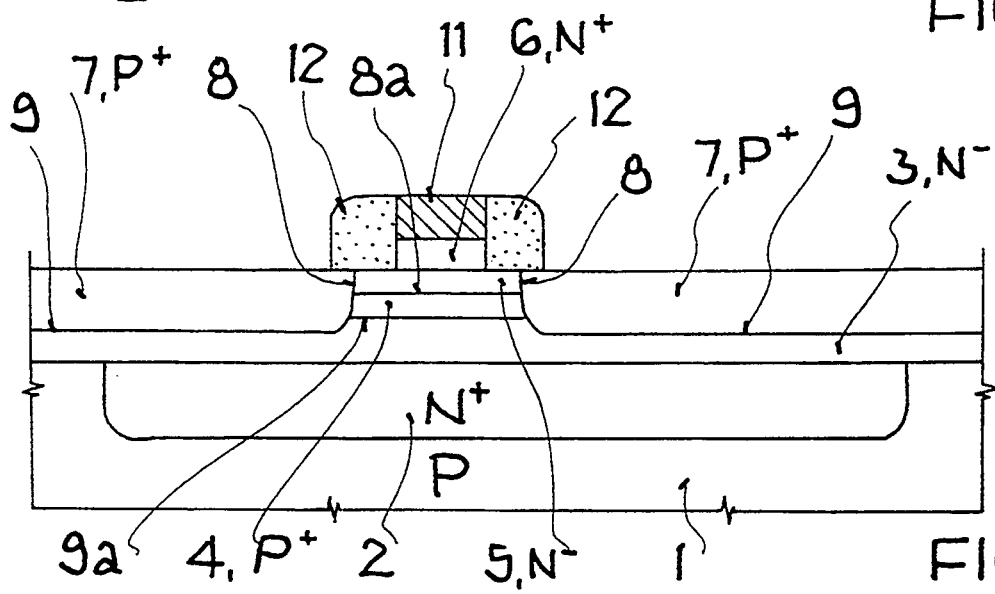
FIG. 4 shows a stage of manufacture subsequent to FIG. 3 of an exemplary method according to the invention.

FIG. 4: A CVD oxide (TEOS) 12 (for example having a layer thickness of 0.3 μm) is conformally deposited over the surface of the semiconductor array and etched back anisotropically such that an oxide layer 12 (spacer) remains only at the vertical edges of the auxiliary layer (11) and of the emitter contact layer 6, and the remaining surface (for the base connection) is exposed; $BF_2$ ions (dose for example $4 \times 10^{15}$ cm$^{-2}$ acceleration voltage for example 40–80 keV) are implanted in the exposed surface to a depth just below the SiGe base layer 4 and hence the emitter region 5 at the side of the oxide spacer 12 is redoped to provide the P+ base connection region 7, and the base collector PN junction 9 moved to underneath the base/collector boundary layer 9a, and the emitter/base/PN junction 8 to underneath the spacer oxide layer 12.

Figure 5:
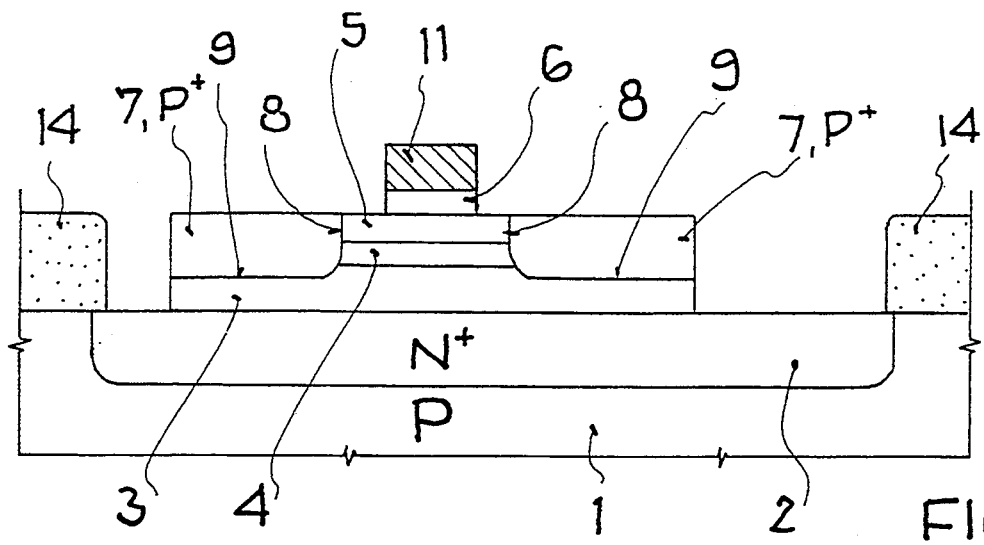
FIG. 5 shows a stage of manufacture subsequent to FIG. 4 of an exemplary method according to the invention.

FIG. 5: The final mesa-type structure is formed by the base connection region 7 and the collector layer 3 being patterned by anisotropic etching; by deposition and patterning of a CVD oxide (layer thickness for example 0.5 μm), field oxide regions 14 are formed that separate the various elements or active structures of the integrated circuit from one another.

Figure 6:
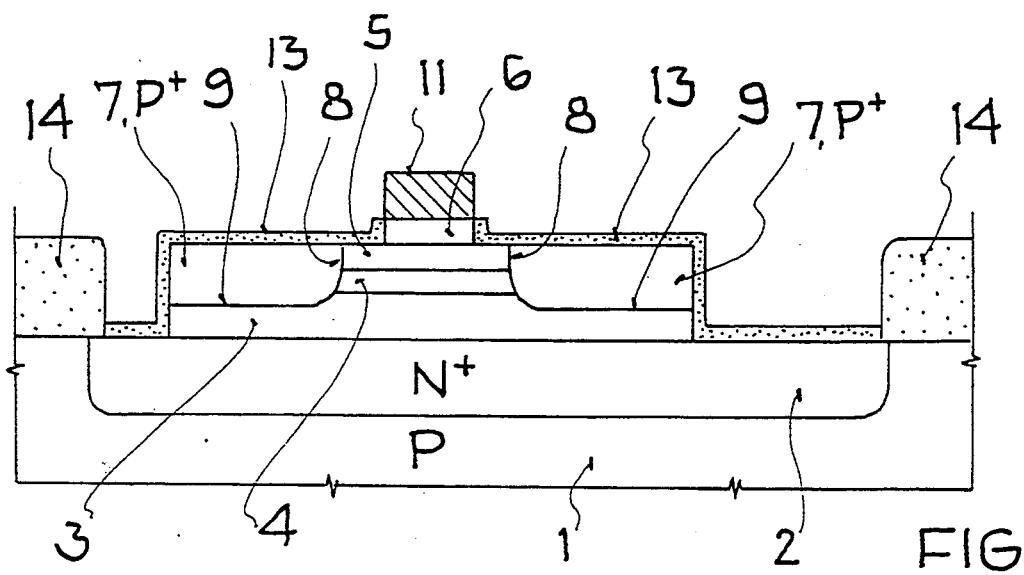
FIG. 6 shows a stage of manufacture subsequent to FIG. 5 of an exemplary method according to the invention.

FIG. 6: By thermal oxidation at a temperature of, for example, 700° C., the exposed surface of the semiconductor array is covered with an $SiO_2$ layer 13 with a thickness of, for example, 10 nm. Both the base/emitter/PN junction 8 and the collector/base/PN junction 9 are passivated on the surface and hence protected from leakage currents.

Figure 7:
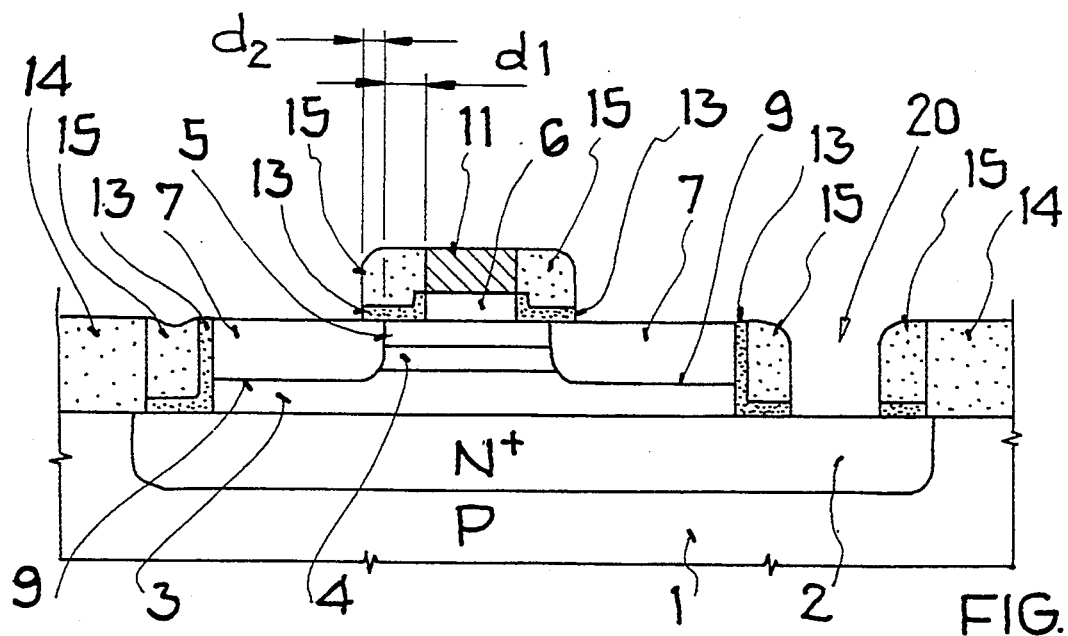
FIG. 7 shows a stage of manufacture subsequent to FIG. 6 of an exemplary method according to the invention.

FIG. 7: A CVD oxide 15 (TEOS) is deposited over the entire surface of the semiconductor array (for example with a layer thickness of 0.5 μm) and etched back anisotropically such that on the one hand the collector contact opening 20 is formed and on the other hand oxide spacers 15 remain that protect the surface of the base/emitter/PN junction 8 over a length $d_2$.

The distances $d_1$ (from the edge of the emitter connection layer 6 to the base connection region 7) and $d_2$ (from the base connection region 7 to the later base metal layer 16) are self-aligned and minimal thanks to the spacer technique described and use of the oxide layers 12 and 15.

Figure 8:
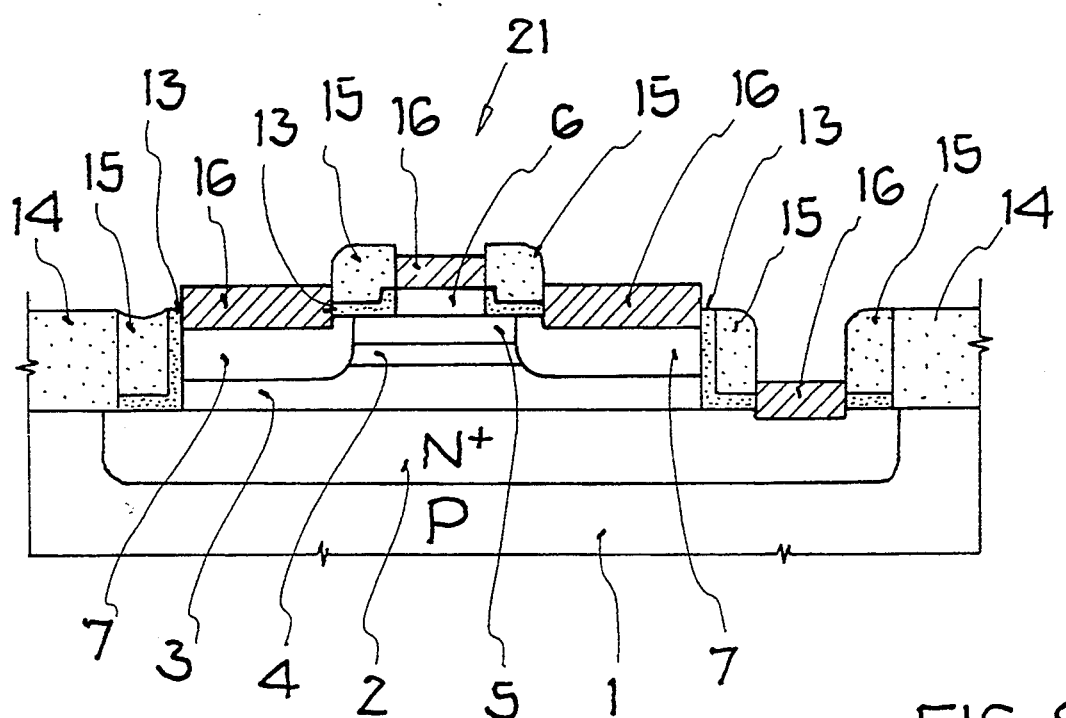
FIG. 8 shows a stage of manufacture subsequent to FIG. 7 of an exemplary method according to the invention.

FIG. 8: The remainder of the $Si_3N_4$ auxiliary layer 11 is removed, and the emitter contact opening 21 is exposed. By vapor deposition of a metal layer 16 (for example titanium) and temperature treatment of said layer a metal silicide (for example titanium silicide) is formed on the surface of the silicon areas 2, 6, 7, while the pure metal remains on the surface of the oxide areas 13, 14, 15; the metal layer above the oxide areas 13, 14, 15 is selectively removed using an etchant solution.

It is then possible, after application of an oxide layer and the manufacture of contact openings for emitter, base and collector, to apply a metallized layer using conventional methods.

SiGe HBTs of this type can however not only be produced on simply patterned substrates as described, but also—for example—on substrates already containing finished components in pure silicon technology (e.g. MOS or bipolar).

What is claimed is:

1. A method for manufacture of a semiconductor array of integrated silicon-germanium heterobipolar transistors having a silicon collector layer, a silicon-germanium base layer, a silicon emitter layer and a silicon emitter contact layer comprising:

depositing in a single uninterrupted process and simultaneously doping said collector layer, said base layer, said emitter layer and said emitter contact layer;

forming a base connection region at the side of said base layer such that the intersection surfaces of the base/emitter/PN boundary layer and of the base/collector PN boundary layer with the surface of the semiconductor array are outside said silicon-germanium base layer; and forming a silicon dioxide layer by thermal oxidation over the entire exposed surface of said semiconductor array.

2. A method according to claim 1, further comprising:

forming a spacer oxide layer such that a defined distance between the base connection region and said base/emitter/PN junction is provided;

opening said emitter contact layer for a self-aligned emitter contact by selective removal of an auxiliary layer while retaining said spacer oxide layer; and simultaneously forming the base contact and the emitter contact by a self-aligned silicide process.

3. A method according to claim 1, wherein the depositing and doping of said semiconductor layers is implemented as a CVD or an MBE method.

4. A method according to claim 1, wherein the forming of said base connection region comprises implanting ions in the surface of said emitter layer such that said base connection region extends to underneath said silicon-germanium base layer.

5. A method according to claim 4, further comprising removing said emitter contact layer above said base connection region.

6. A method according to claim 4, wherein the distance between said base connection region and said emitter contact layer is self-aligned and minimal, the method further comprising;

depositing an auxiliary layer over the entire surface of said emitter contact layer;

patterning said auxiliary layer and said emitter contact layer by removing part of said auxiliary layer and said emitter contact layer;

depositing and patterning an oxide layer over the entire surface of said semiconductor array such that a first spacer oxide layer remains; and using said auxiliary layer and said first spacer oxide layer for masking during ion implantation.

7. A method according to claim 6, further comprising forming a second spacer oxide layer wider than said first spacer oxide layer; and depositing over the entire surface and patterning with self-alignment a metal layer using said second spacer oxide layer.

8. A method according to claim 7, wherein the forming said second spacer oxide layer and the depositing and patterning of said metal layer comprise:

depositing an oxide layer over the entire surface of said semiconductor array;

selectively etching said oxide layer such that at each side of said auxiliary layer a part of said oxide layer remains as said second spacer oxide layer;

removing said auxiliary layer;

depositing said metal layer over the entire surfaces of the exposed silicon and silicon oxide areas; and after silicidation of said metal layer above said silicon areas, selectively removing said metal layer from the surface of said silicon oxide areas.

9. A method according to claim 1, further comprising etching a part of said base connection region and said collector layer to achieve a mesa-type structure of said semiconductor array.

10. A method according to claim 1 for manufacture of integrated NPN silicon-germanium heterobipolar transistors.

* * * * *